(12) United States Patent
Koval et al.

(10) Patent No.: US 10,622,450 B2
(45) Date of Patent: Apr. 14, 2020

(54) MODIFIED FLOATING GATE AND DIELECTRIC LAYER GEOMETRY IN 3D MEMORY ARRAYS

(71) Applicant: Intel Corporation, Santa Clara, CA (US)

(72) Inventors: Randy Koval, Boise, ID (US); Srikant Jayanti, Singapore (SG); Hiroyuki Sanda, San Jose, CA (US); Meng-Wei Kuo, Boise, ID (US); Srivardhan Gowda, Boise, ID (US); Krishna Parat, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/022,540

(22) Filed: Jun. 28, 2018

(65) Prior Publication Data
US 2019/0043960 A1    Feb. 7, 2019

(51) Int. Cl.
| | |
|---|---|
| *H01L 29/423* | (2006.01) |
| *H01L 27/11556* | (2017.01) |
| *H01L 27/11521* | (2017.01) |
| *H01L 29/06* | (2006.01) |
| *H01L 29/10* | (2006.01) |

(Continued)

(52) U.S. Cl.
CPC .... *H01L 29/42324* (2013.01); *H01L 21/0217* (2013.01); *H01L 21/31111* (2013.01); *H01L 21/32133* (2013.01); *H01L 27/11521* (2013.01); *H01L 27/11556* (2013.01); *H01L 29/04* (2013.01); *H01L 29/0649* (2013.01); *H01L 29/1037* (2013.01); *H01L 29/40114* (2019.08); *H01L 21/0262* (2013.01); *H01L 21/02164* (2013.01); *H01L 21/02271* (2013.01); *H01L 21/02532* (2013.01); *H01L 21/02595* (2013.01); *H01L 27/11519* (2013.01); *H01L 29/7883* (2013.01)

(58) Field of Classification Search
CPC ......... H01L 27/11521; H01L 29/42324; H01L 29/40114
See application file for complete search history.

(56) References Cited

U.S. PATENT DOCUMENTS

| 8,878,279 | B2 | 11/2014 | Koval |
| 9,196,625 | B2 | 11/2015 | Koval |

(Continued)

*Primary Examiner* — Quoc D Hoang
(74) *Attorney, Agent, or Firm* — Schwabe, Williamson & Wyatt, P.C.

(57) ABSTRACT

A 3D memory structure including a modified floating gate and dielectric layer geometry is described. In embodiments, a memory cell includes a channel region and a floating gate where a length of the floating gate along a direction of the channel region is substantially longer than a length of the floating gate along an orthogonal direction along the channel region. A control gate adjacent to the floating gate extends at least as long as the control gate along the direction of the channel region and includes a tapered edge extending away from the channel region towards the control gate. In embodiments, a dielectric layer between the control gate and the floating gate may follow the tapered edge along the floating gate and form a discrete region proximate to the floating gate to at least partially insulate the floating gate from an adjacent memory cell. Other embodiments are disclosed and claimed.

15 Claims, 12 Drawing Sheets

(51) Int. Cl.
*H01L 29/04* (2006.01)
*H01L 21/311* (2006.01)
*H01L 21/3213* (2006.01)
*H01L 21/02* (2006.01)
*H01L 21/28* (2006.01)
*H01L 27/11519* (2017.01)
*H01L 29/788* (2006.01)

(56) References Cited

U.S. PATENT DOCUMENTS

| | | |
|---|---|---|
| 9,793,282 B2 | 10/2017 | Dennison et al. |
| 9,966,449 B2 | 5/2018 | Kittl |
| 9,966,451 B1 * | 5/2018 | Lee .................. H01L 27/11556 |
| 2013/0105880 A1 * | 5/2013 | Kim .................. H01L 21/28273 |
| | | 257/316 |

* cited by examiner

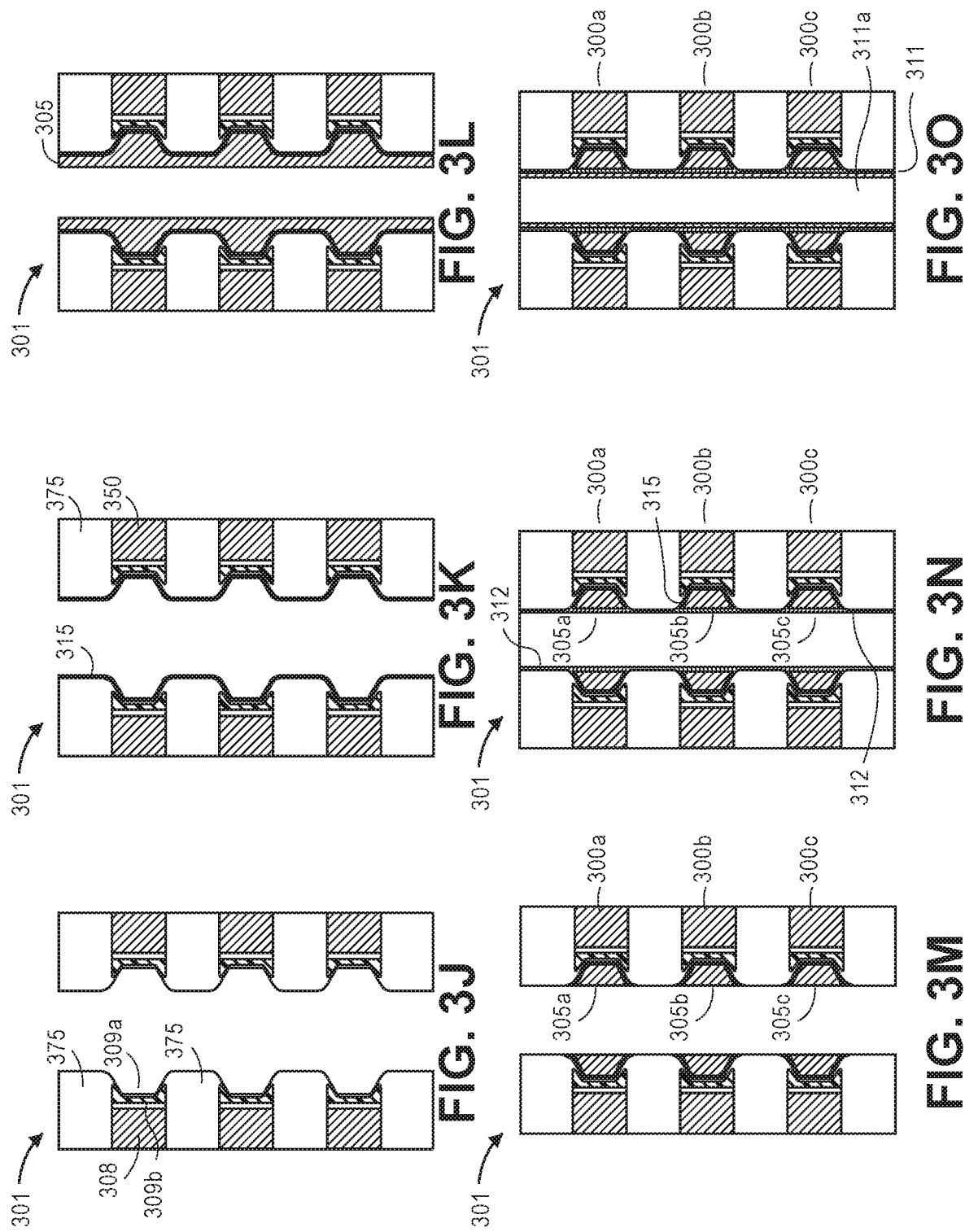

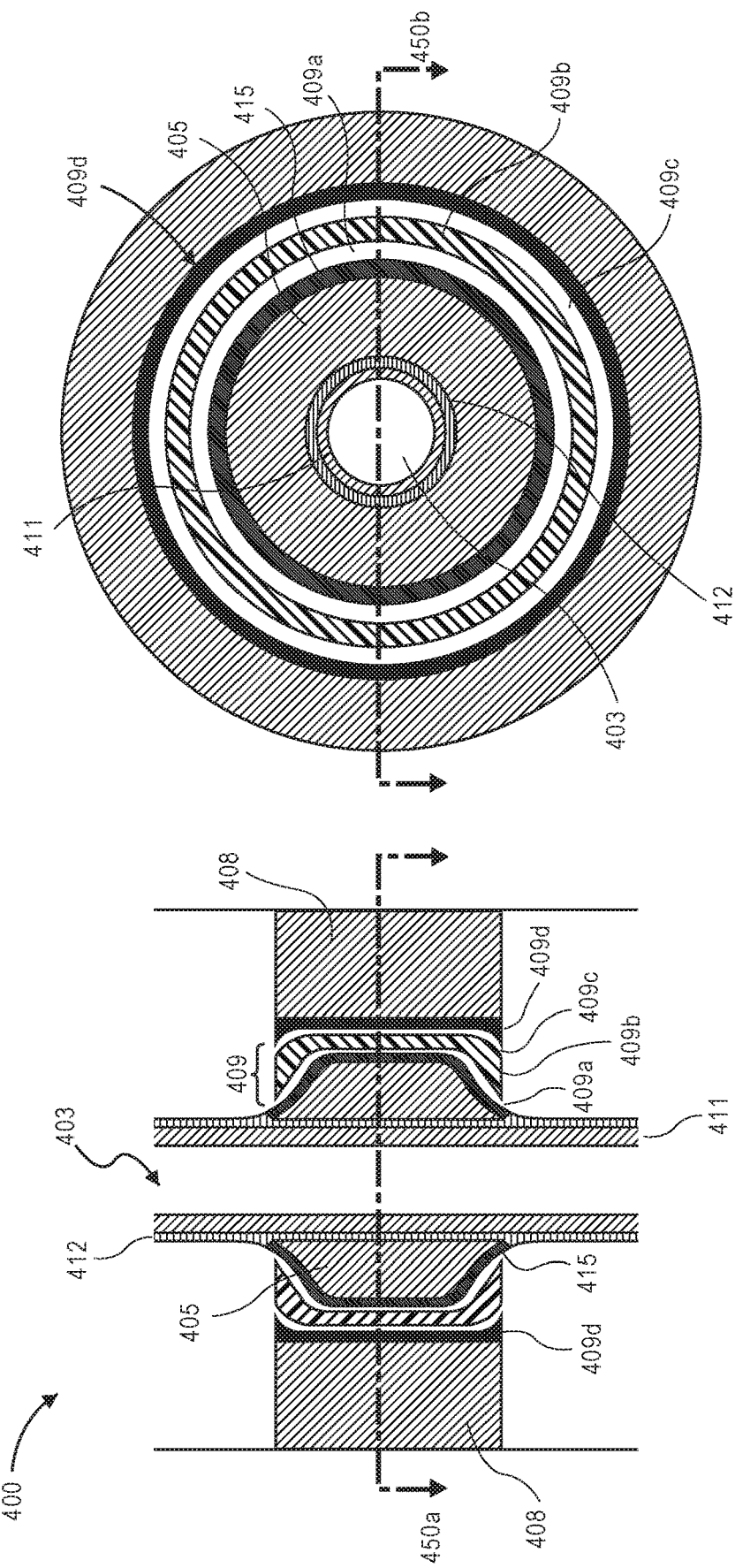

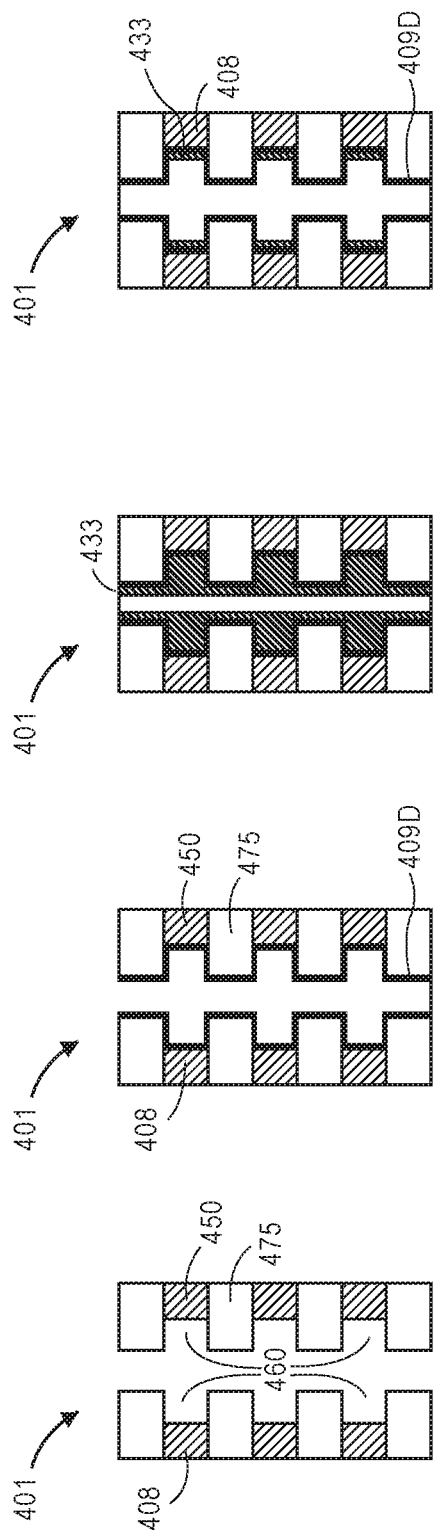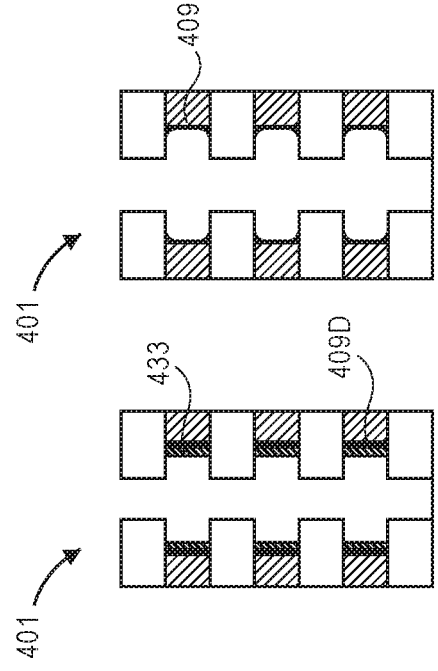

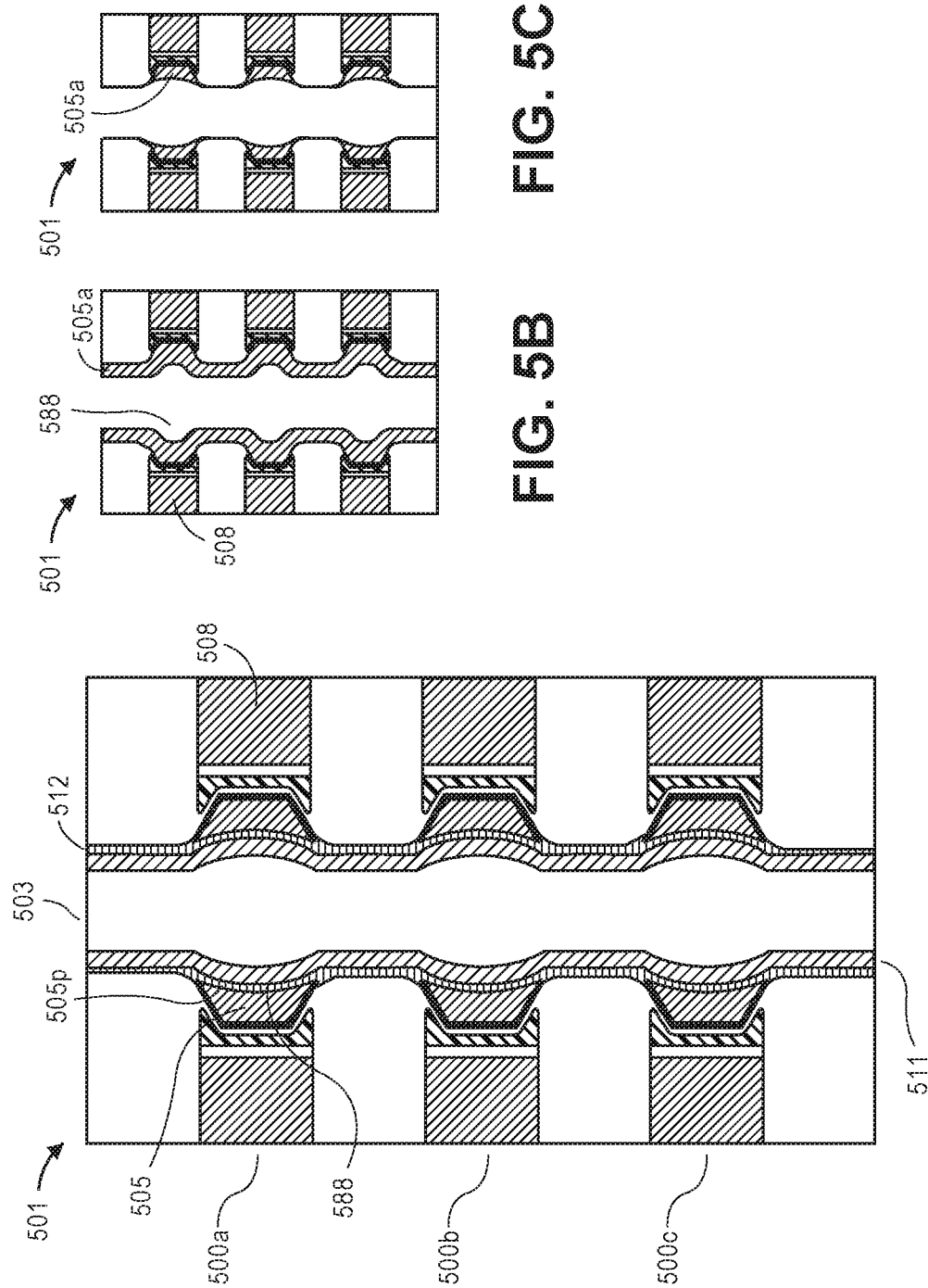

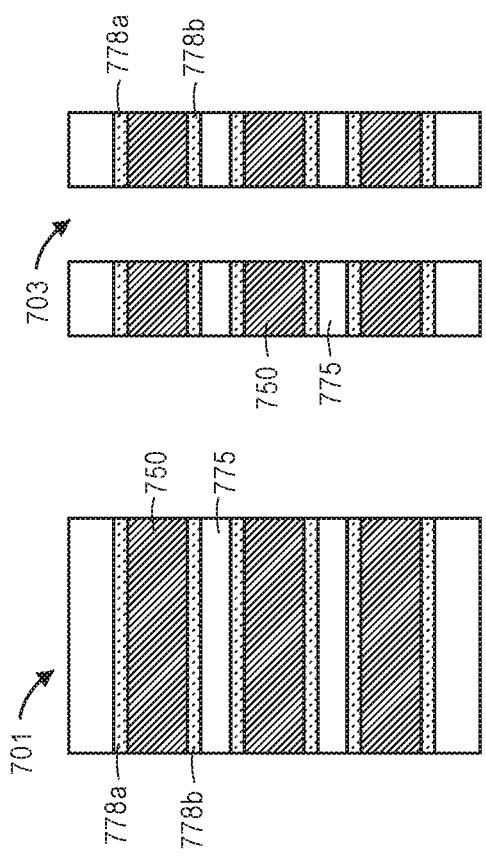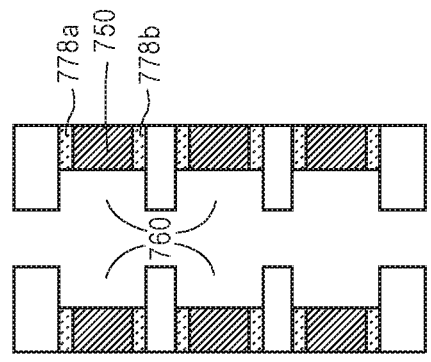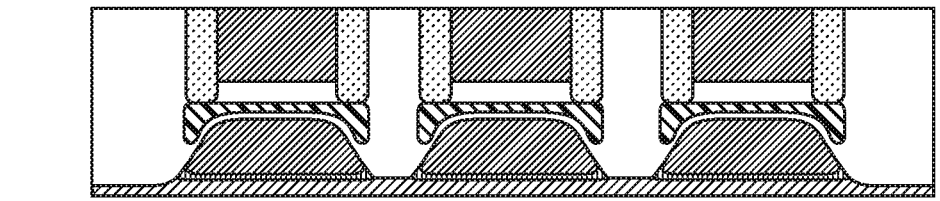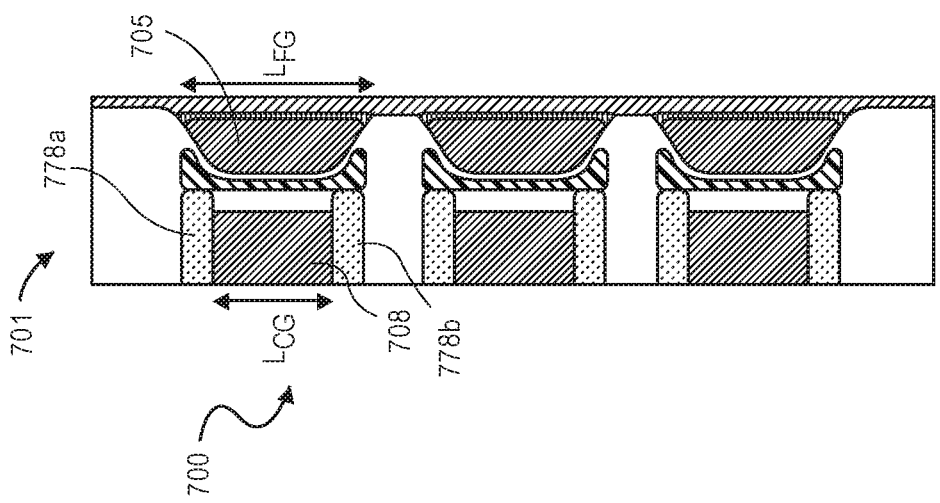
FIG. 7A
FIG. 7B
FIG. 7C
FIG. 7C1
FIG. 7C2

MODIFIED FLOATING GATE AND DIELECTRIC LAYER GEOMETRY IN 3D MEMORY ARRAYS

FIELD

Embodiments of the present disclosure generally relate to the field of integrated circuits (IC), and more particularly, to fabrication techniques for a non-volatile memory device.

BACKGROUND

A typical flash memory device may include a memory array that includes a large number of non-volatile memory cells arranged in row and column fashion. In recent years, vertical memory, such as three-dimensional (3D) memory, has been developed in various forms, such as NAND, cross-point, or the like. A 3D flash memory array may include a plurality of memory cells stacked over one another to form a vertical NAND string. In a floating gate flash cell, a conductive floating gate may be positioned between a control gate and a channel of a transistor. The individual memory cells of the vertical NAND string may be on different layers arranged around a body that extends outward from a substrate, with the conductive floating gate (charge storage region) located on a similar or same plane as the control gate, extending outward horizontally from the body.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIGS. 4A and 4B illustrate side and top cross-sectional views of a memory cell having a modified floating gate and dielectric layer geometry, in accordance with another embodiment of the present disclosure.

FIGS. 4C-4C5 schematically illustrate example cross-sectional side views of a memory structure, showing different stages of forming one or more memory cells described in connection with FIGS. 4A and 4B, in accordance with various embodiments of the present disclosure.

FIGS. 5A-5C illustrate an additional embodiment of a memory structure including one or more memory cells having a plano-concave curvature of a floating gate, in accordance with another embodiment of the present disclosure.

FIGS. 7A-7C2 illustrate an embodiment of a memory structure including one or more memory cells where a length a floating gate may be longer than a length of the control gate in accordance with another embodiment of the present disclosure.

DETAILED DESCRIPTION

Figure 1A:
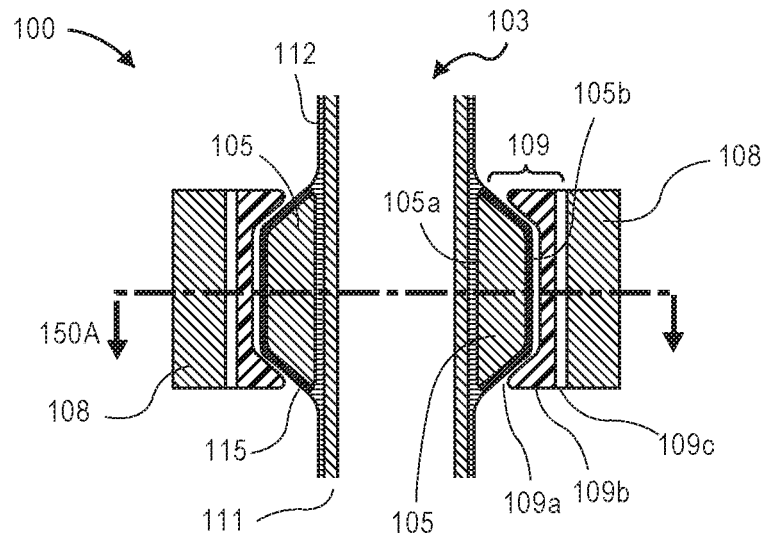
FIGS. 1A-1F are side and top cross-sectional views of one or more memory cells having a modified floating gate and dielectric layer geometry, in accordance with embodiments of the present disclosure.

In a memory device, a memory structure or array including one or more memory cells having a modified floating gate and dielectric layer geometry are described, in accordance with embodiments. In embodiments, a memory cell includes a channel region, a floating gate, and an adjacent control gate. In embodiments, a length of the floating gate along a direction of the channel region is substantially longer than along a length of the floating gate along an orthogonal direction of the channel region. In embodiments, the floating gate includes a tapered edge extending away from the channel region towards the control gate. In embodiments, the memory cell further includes a dielectric layer disposed between the floating gate and the adjacent control gate. Additionally, in embodiments, the dielectric layer may follow the tapered edge along the floating gate and may form a discrete region proximate to the floating gate to at least partially insulate the floating gate from an adjacent memory cell. In embodiments, the memory array may include, e.g., a 3D NAND vertical memory array.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure; however, the order of description should not be construed to imply that these operations are necessarily order dependent. In particular, these operations need not be performed in the order of presentation.

Figure 1B:
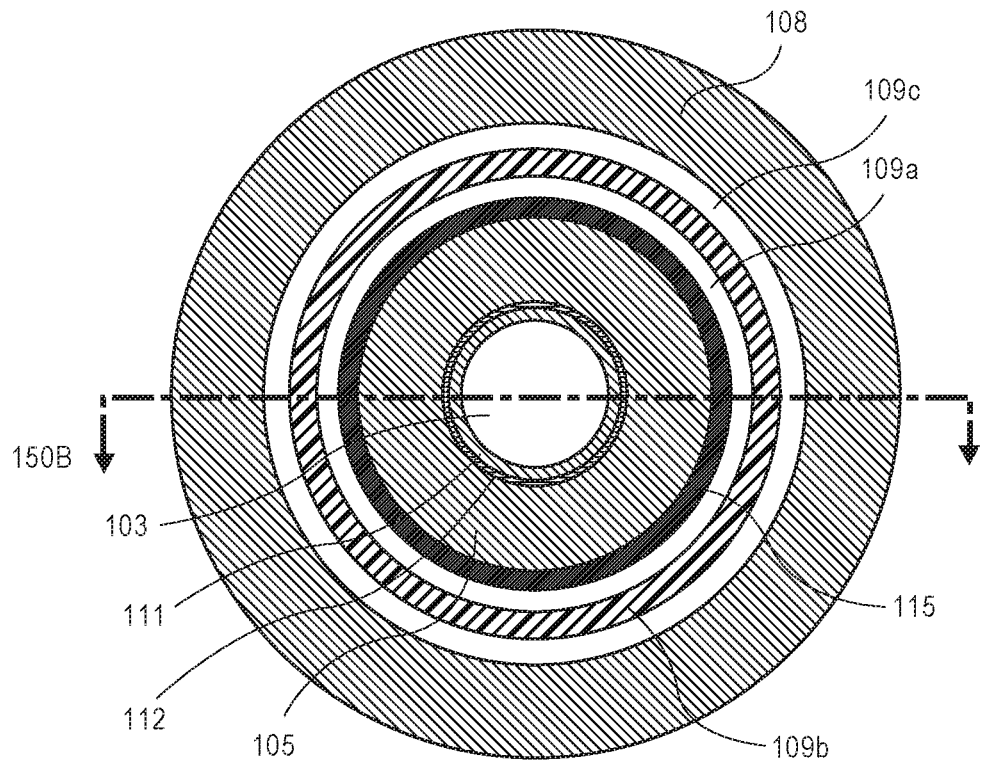

FIGS. 1A and 1B respectively show side and top cross-sectional views of a memory cell 100 with a modified floating gate and dielectric layer geometry, in accordance with embodiments. Line 150A of FIG. 1A illustrates the location of the cross-sectional view of FIG. 1B, and line 150B of FIG. 1B illustrates the location of the cross-sectional view of FIG. 1A. In embodiments, a channel including a channel region extends from a substrate that may include a base wafer or another structure upon which various materials be deposited, grown, or otherwise put in place in various patterns, layers, and thicknesses with a variety of processes to create the circuitry for a memory device. Accordingly, memory cell 100 may be formed from a pillar-like structure ("pillar") with a substantially circular cross-section as seen in FIG. 1B. In embodiments, the pillar may be formed of a semi-conductor material that may be a polysilicon material in some embodiments. In various embodiments, the pillar may be formed of materials such as doped crystalline silicon, gallium arsenide, germanium, or other semiconductors. In embodiments, a polysilicon liner may be included along a length of the pillar. In embodiments, a channel or channel region may be shared among a plurality of memory cells, with an individual memory cell 100 using a portion of the pillar for its channel region.

Accordingly, FIG. 1A illustrates a memory cell 100 that includes channel region 103, a floating gate 105 adjacent to channel region 103 along a first side 105a of floating gate 105, and a control gate 108 along an opposing second side 105b of floating gate 105. In embodiments, floating gate 105 and control gate 108 may include a conductive material, e.g., polysilicon. In embodiments, a multi-layer dielectric or interpoly dielectric (IPD) region 109 is disposed between floating gate 105 and control gate 108. In embodiments, IPD region 109 may include a first IPD layer 109a, a second IPD layer 109b, and a third IPD layer 109c. In embodiments, first IPD layer 109a and third IPD layer 109c may each be disposed on opposing sides of second IPD layer 109b, which may be a middle or second dielectric layer. In embodiments, e.g., the middle dielectric layer is made of a material having a higher dielectric constant than first IPD layer 109a and third IPD layer 109c. For example, first IPD layer 109a and third IPD layer 109c may include silicon oxide layers, and second IPD layer 109b may be made of silicon nitride or another high dielectric constant insulator. In embodiments, and as discussed in more detail with respect to FIG. 1E, a barrier layer 115 is disposed between IPD region 109 and floating gate 105.

In embodiments, channel region 103 may include a channel liner or channel semiconductor film 111 that may include a semiconductor material such as polysilicon and may be included adjacent to a tunnel dielectric layer 112. In embodiments, tunnel dielectric layer 112 may include any suitable dielectric material, and may typically include silicon oxide. In embodiments, the pillar may comprise a channel fill that may include a dielectric material, such as, e.g., silicon oxide.

Figure 1C:
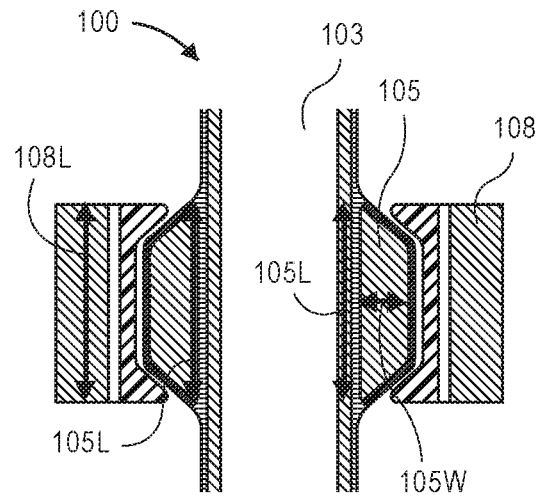
Figure 1D:
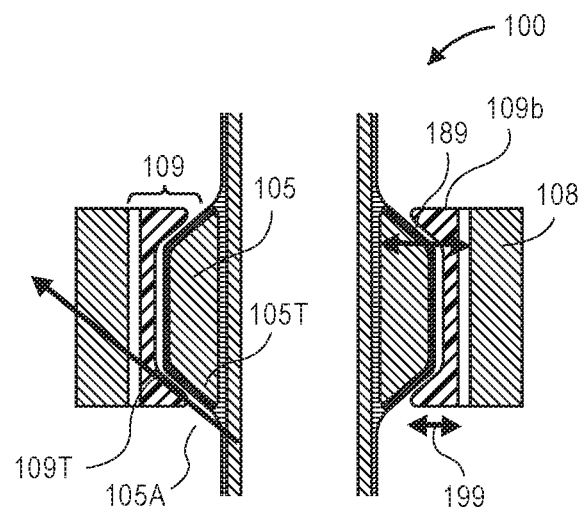
Figure 1E:
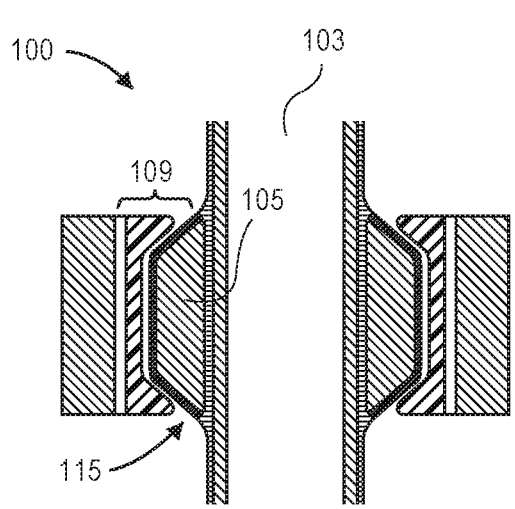

FIGS. 1C, 1D, and 1E show side cross-sectional views of memory cell 100 of FIGS. 1A and 1B, in accordance with some embodiments. In embodiments, 1C, 1D, and 1E illustrate features of a modified floating gate and dielectric layer geometry that may contribute to an improved device performance and reliability of memory cell 100. In embodiments, FIGS. 1C, 1D, and 1E include same or similar elements as introduced in FIG. 1A and as such, for purposes of clarity only certain elements will be reintroduced. In embodiments, as introduced above, memory cell 100 includes floating gate 105 adjacent to channel region 103 along a first side 105a and a control gate 108 adjacent to floating gate 105 along an opposing second side 105b of floating gate 105.

In the embodiment of FIG. 1C, a modified floating gate geometry includes a length 105L of floating gate 105 extending at least as long as a length 108L of control gate 108 along a direction of channel region 103. Furthermore, in embodiments, length 105L of floating gate 105 along a direction of channel region 103 may be substantially longer than along an orthogonal direction 105W of channel region 103

In embodiments, FIG. 1D illustrates an additional feature of a modified floating gate geometry that may contribute to an improved device performance and reliability of memory cell 100. In embodiments, as indicated at arrow 105A, floating gate 105 includes one or more tapered edges 105T extending away from channel region 103 towards control gate 108. In embodiments, tapered edge 105T may narrow the floating gate towards the control gate. In embodiments, as also illustrated by arrow 105A, one or more tapered edges 109T of IPD region 109 may also extend away from channel region 103 towards control gate 108. Accordingly, in embodiments, a portion of middle or second dielectric layer 109b follows tapered edge 109T proximate to floating gate 105. Furthermore, as shown by an arrow 199, second IPD layer 109b may extend only approximately half-way of a thickness (see, e.g., arrow 189) of floating gate 105, according to various embodiments. Note that in embodiments, in the FIG. 1D, only one tapered edge 105T of floating gate 105 has been indicated, but floating gate 105 and IPD region 109 (and including second IPD layer 109b) each have an additional tapered edge on an opposing side.

FIG. 1E illustrates in further detail barrier layer 115. In embodiments, barrier layer 115 may include an insulator material disposed between IPD region 109 and floating gate 105. In embodiments, barrier layer 115 is in direct contact with floating gate 105 and may comprise silicon nitride. In embodiments, barrier layer 115 may be considered a fourth layer of IPD region 109 and as can be seen from FIG. 1E, may form a discrete barrier layer for memory cell 100 (i.e., a barrier layer not shared by another proximate memory cell that may be located along the channel or channel region 103). In embodiments, barrier layer 115 may include silicon nitride but in other embodiments, may also include another dielectric material having a higher dielectric constant than silicon oxide.

Figure 1F:
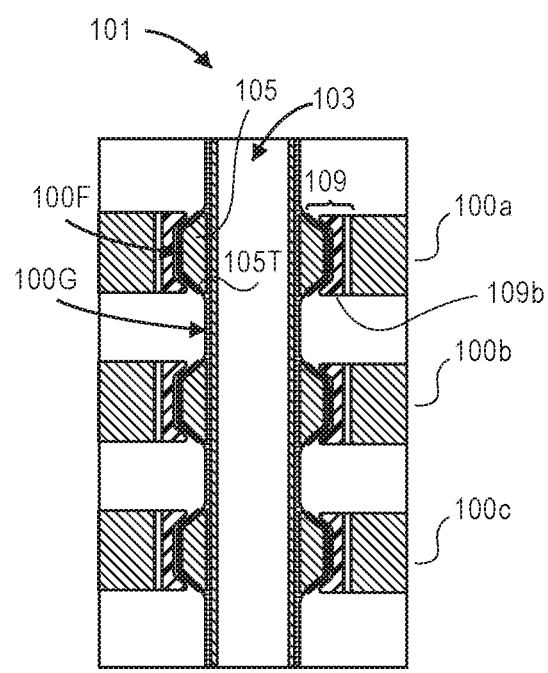

FIG. 1F illustrates a portion of a memory structure 101 including a plurality of memory cells 100a, 100b, and 100c. In embodiments, memory structure 101 includes a vertical 3D NAND string of coupled memory cells, e.g., memory cells 100a, 100b, and 100c, along a direction of channel region 103. In embodiments, a dielectric layer, e.g., middle or second IPD layer 109b, may form a discrete region for each memory cell 100a, 100b, or 100c, proximate to floating gate 105 to at least partially insulate floating gate 105 from an adjacent memory cell. Accordingly, in embodiments, second IPD layer 109b is fully isolated and/or insulated by a substantially surrounding dielectric (e.g., silicon oxide) in each direction. In embodiments, and as noted above, second IPD layer 109b may include silicon nitride and may be discretely defined (as noted by a location of second IPD layer 109b at location 100F and an absence of second IPD layer 109b at location 100G, between memory cells 100a and 100b) for each of the plurality of memory cells 100a, 100b, and 100c.

Accordingly, in embodiments, a memory structure includes a modified dielectric layer geometry where a middle or second dielectric layer may be disposed between the control gate and the floating gate, and follow a tapered edge 105T of the floating gate 105 to form a discrete region to at least partially insulate the floating gate from an adjacent memory cell, e.g., one or more memory cells 100a, 100b, or 100c. Note that second IPD layer 109b of IPD region 109 has only been indicated once in the FIG. 1F for memory cell 100a, but that each of memory cells 100b and 100c include a corresponding second IPD or dielectric layer to at least partially insulate a corresponding floating gate from an adjacent memory cell.

Figure 2:
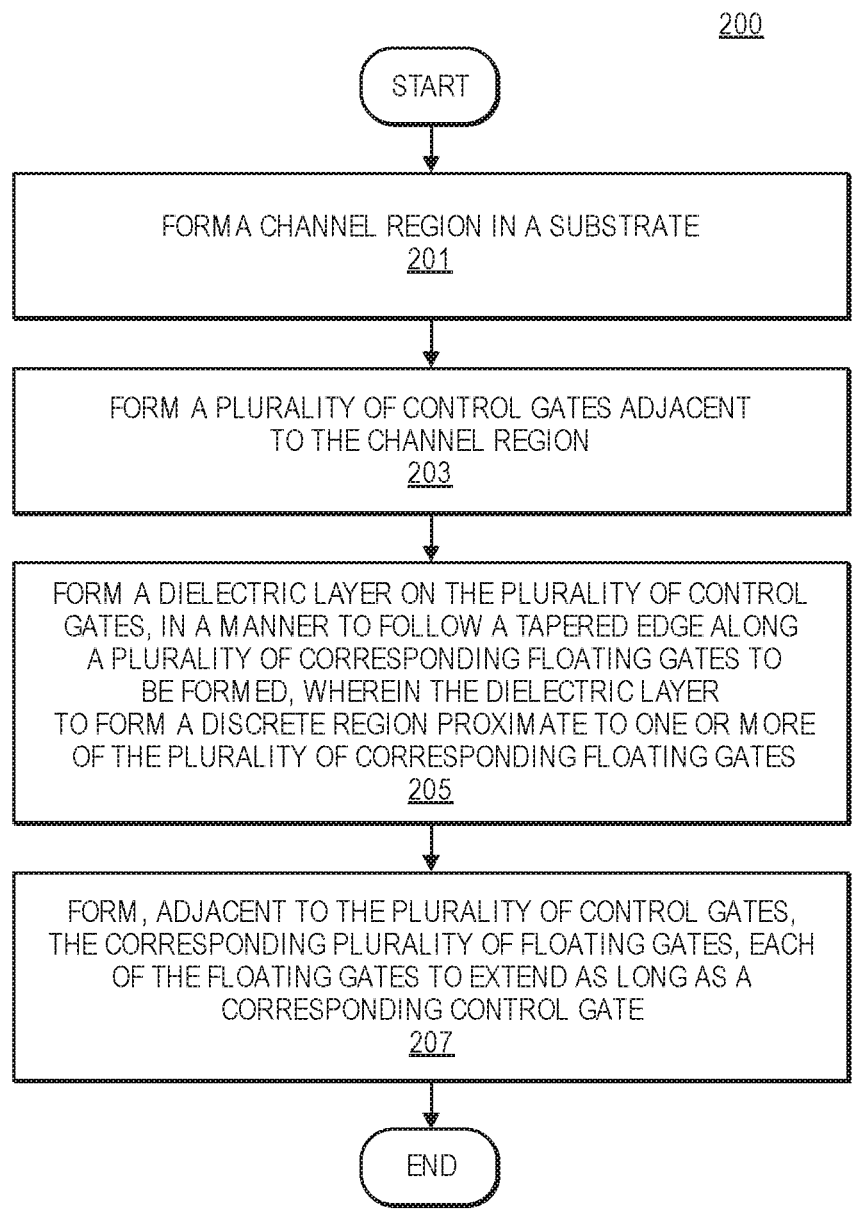
FIG. 2 is a flow diagram describing a process associated with forming the one or more memory cells of FIGS. 1A-1F, in accordance with embodiments of the present disclosure.
Figure 3A:
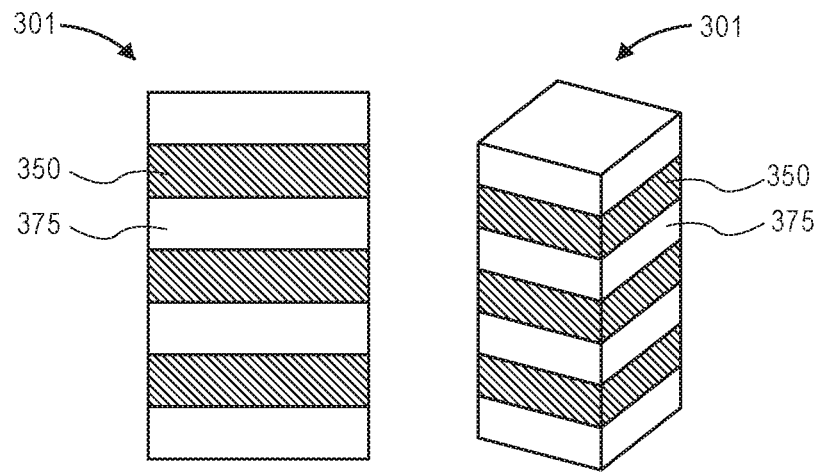
FIGS. 3A-3O schematically illustrate example perspective or cross-sectional side views showing different stages of forming the one or more memory cells as described in FIG. 2, in accordance with embodiments of the present disclosure.

FIG. 2 and FIGS. 3A-3O are discussed together below. FIG. 2 is a flow diagram describing a process 200 of forming a memory structure with a modified floating gate and dielectric layer geometry, in accordance with embodiments. FIGS. 3A-3O show cross-sectional side and perspective views of various stages associated with process 200. In embodiments, at a block 201, process 200 includes forming, in a substrate, a channel region. Accordingly, in embodiments, FIG. 3A illustrates on a left side of FIG. 3A, a front view, and, on a right side, a perspective view of a substrate 301. In embodiments, forming substrate 301 may include depositing alternating layers of conductor 350 ("conductor layer 350" or "conductor 350") and insulator 375 ("insulator layer 375" or "insulator 375") to form a stack. In embodiments, forming the stack may typically include low pressure chemical vapor deposition (LPCVD) deposited polysilicon and silicon oxide.

Figure 3B:
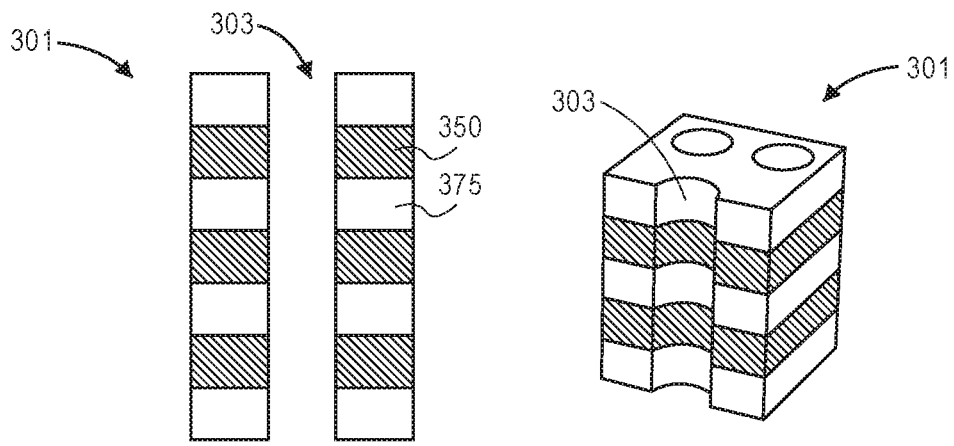
Figure 3C:
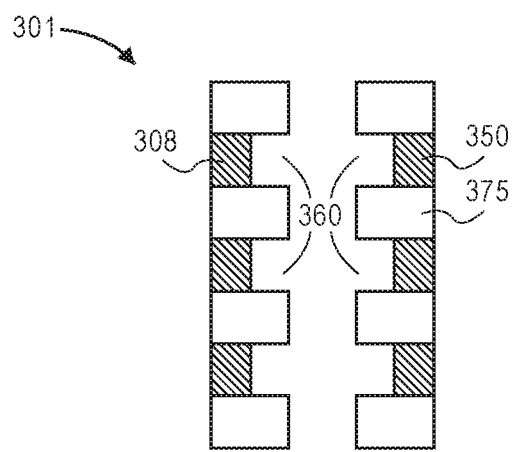

Next, FIG. 3B illustrates forming of a channel or channel region 303 in substrate 301 by anisotropic etching of a cylinder-shaped hole through substrate 301 including the stack of alternating conductor layer(s) 350 and insulator layer(s) 375, for the embodiment. In embodiments, a next block 203 of FIG. 2 includes forming a plurality of control gates adjacent to a channel region 303. Accordingly, FIG. 3C illustrates an embodiment where forming a plurality of control gates 308 may include isotropic etching of conductor layer(s) 350 in the stack of alternating conductor layers 350 and insulator layers 375 to create a plurality of cavity regions 360.

Figure 3D:
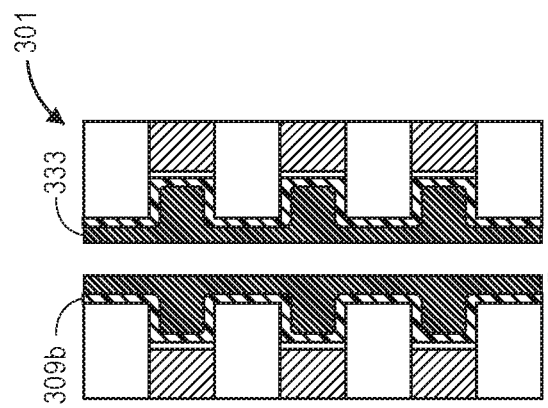

Returning to FIG. 2, at block 205, the process 200 includes forming a dielectric layer on the plurality of control gates. In embodiments, the dielectric layer may be disposed between the plurality of control gates and a corresponding plurality of floating gates. In embodiments, the dielectric layer may be formed in a manner to follow a tapered edge along one or more of the floating gates and in a manner to form a discrete region proximate to the one or more floating gates. In embodiments, forming the dielectric layer of block 205 in process 200 ("process") may be described in accordance with FIGS. 3D-3K, as described below. In embodiments, forming the dielectric layer begins by forming a multi-layer dielectric (e.g., IPD region 109 of FIG. 1) over a plurality of cavity regions 360. In embodiments, this may include, as shown in FIG. 3D, growing or depositing a first IPD layer 309a of the multi-layer dielectric including, e.g., silicon oxide over a bottom region of each of the plurality of cavity regions 360. In embodiments, first IPD layer 309a may be silicon oxide grown from polysilicon.

Figure 3E:
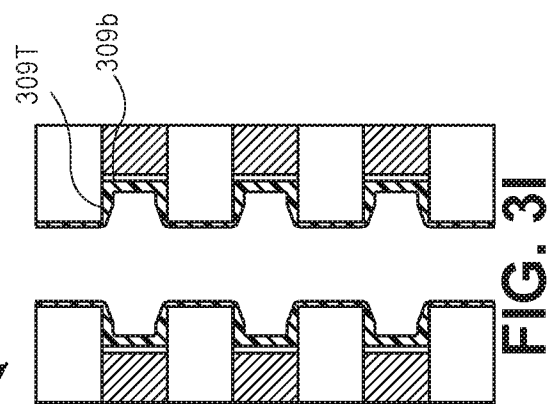

Next, in the embodiment, as shown in FIG. 3E, the process includes growing or depositing a middle dielectric layer of a multi-layer dielectric or a second IPD layer 309b of a interpoly dielectric (IPD) region over a surface of each of the plurality of cavity regions 360. In embodiments, depositing second IPD layer 309b may include growing or depositing a silicon nitride layer.

Figure 3F:
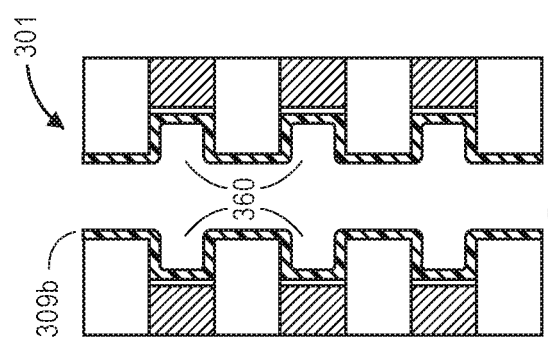
Figure 3G:
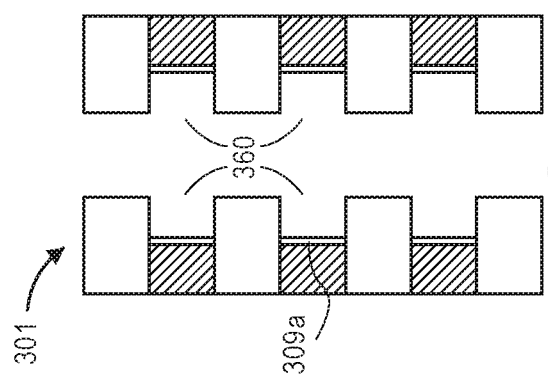

Next, in the embodiment, as shown in FIG. 3F, the process includes growing or depositing a sacrificial protection layer 333 over second IPD layer 309b. Accordingly, next, as shown in FIG. 3G, process 200 may include etch processing sacrificial protection layer 333 to leave a portion of sacrificial protection layer 333 in a bottom of cavity regions 360 over second IPD layer 309b, in the embodiment. In embodiments, chemistries that provide high etch removal selectivity may be used.

Figure 3H:
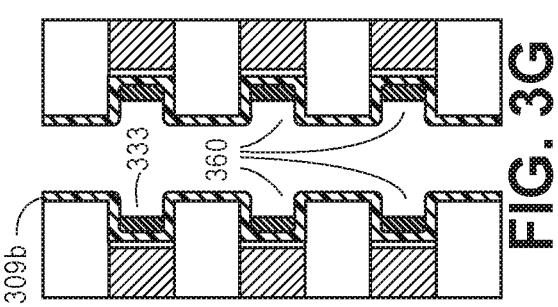

Next, in embodiments, as shown in FIG. 3H, the process includes selectively oxidizing or etching portions of the silicon nitride layer or second IPD layer 309b to form a tapered edge 309T. In embodiments, formation of a tapered feature of a modified floating gate and dielectric layer geometry may begin at this stage.

Figure 3I:
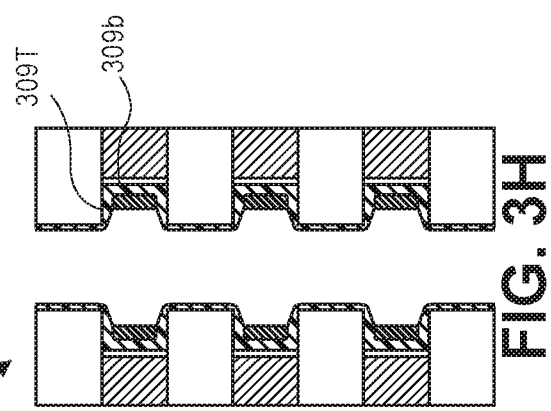

Next, in embodiments, as shown in FIG. 3I, a remaining portion 335 of sacrificial protection layer 333 may be removed, leaving second IPD layer 309b having a tapered edge 309T.

Next, in embodiments, as shown in FIG. 3J, the process includes removing portions of second IPD layer 309b that cover insulator layers 375 between one or more of control gate regions 308. In embodiments, the process may further include growing an additional layer 309a of the multi-layer dielectric to substantially insulate second IPD layer 309b.

Next, in embodiments, as shown in FIG. 3K, the process includes depositing an additional layer 315 ("barrier layer 315") over the multi-layer dielectric and over both alternating layers of conductor 350 and isolator 375. In embodiments, additional layer 315 comprises an atomic layer deposition (ALD) of silicon nitride.

Accordingly, returning to FIG. 2, in embodiments, the dielectric layer of block 205 of FIG. 2 has substantially been formed in connection with FIGS. 3D-3K.

Next, at block 207 of FIG. 2, process 200 includes forming, adjacent to the plurality of control gates, a corresponding plurality of floating gates, each of the floating gates to extend as long as a corresponding control gate. In some embodiments, forming the corresponding plurality of floating gates of block 207 may be described in accordance with FIGS. 3L-3O.

Accordingly, at FIG. 3L, the process includes depositing a polysilicon material 305 that may become one or more floating gates. Next, in embodiments, as shown in FIG. 3M, a partial etchback of polysilicon material 305 may form discrete floating gates 305a, 305b, and 305c. In embodiments, as shown, some of all of barrier layer 315 (e.g., silicon nitride, as noted in FIG. 3K) between one or more floating gates 305a, 305b, and 305c may be removed to achieve a silicon nitride isolation between adjacent memory cells, e.g., 300a, 300b, and 300c.

Next, in embodiments, as shown in FIG. 3N, a tunnel dielectric layer 312 (e.g., see tunnel dielectric layer 112) is formed. In embodiments, a silicon oxide may be grown on polysilicon material of floating gates 305a, 305b, and 305c. In embodiments, this stage of FIG. 3N may substantially complete isolation of the barrier layer 315 (e.g., silicon nitride layer) between adjacent memory cells, e.g., 300a, 300b, and 300c.

Finally, next, in embodiments, as shown in FIG. 3O, a channel semiconductor film 311 is deposited. In embodiments, dielectric fill 311a may then complete formation of memory cells 300a, 300b, and 300c. In embodiments, the forming of the plurality of control gates of block 207 is also complete.

FIGS. 4A and 4B illustrate respective side and top cross-sectional views of a memory cell having a modified floating gate and dielectric layer geometry, in accordance with another embodiment. In embodiments, memory cell 400 may be similar to memory cell 100 of FIGS. 1A and 1B and memory cells 300a, 300b, and 300c of FIGS. 3A-3O, however, with an additional barrier layer adjacent to the control gate. In embodiments, the additional barrier layer may be considered a fifth IPD layer. Accordingly, in embodiments, line 450A of FIG. 4A illustrates the location of the cross-sectional view of FIG. 4B, and line 450B of FIG. 4B illustrates the location of the cross-sectional view of FIG. 4A.

Accordingly, FIGS. 4A and 4B illustrate memory cell 400 that includes a channel region 403 that may include a channel semiconductor film 411 lined by a tunnel dielectric layer 412. Memory cell 400 includes a floating gate 405 adjacent to channel region 403 on a first side of floating gate 405, and a control gate 408 along an opposing second side of floating gate 405, in embodiments. In embodiments, floating gate 405 and control gate 408 include a conductive material, e.g., polysilicon. In embodiments, a multi-layer dielectric or interpoly dielectric (IPD) region 409 may be disposed between floating gate 405 and control gate 408. Accordingly, in embodiments, IPD region 409 may include a first IPD layer 409a, a middle or a second IPD layer 409b, and a third IPD layer 409c. In embodiments, second IPD layer 409b may be a dielectric layer 409b made of a material having a higher dielectric constant than first IPD layer 409a and third IPD layer 409c. In embodiments, first and third IPD layers 409a and 409c may include silicon oxide layers and second dielectric layer 409b may be made of silicon nitride or other high dielectric constant insulator. In embodiments, a barrier layer (similar to barrier layer 115 of FIG. 1), or what may be considered a fourth IPD layer 415, is adjacent to floating gate 405. In the embodiment of FIG. 4, a fifth IPD layer 409D may be disposed adjacent to control gate 408.

In embodiments, a process to form a memory cell 400 may be similar to the process of forming one or more memory cell(s) 100 as described in FIGS. 3A-3O, modified to include additional stages including adding a fifth IPD layer. In embodiments, FIGS. 4C-4C5, which include depositing the fifth IPD layer (e.g., silicon nitride) and subsequent tapered etch, may replace FIG. 3D in FIGS. 3A-3O. Accordingly, at FIG. 4C, forming a plurality of control gates 408 includes isotropic etching of conductor layer(s) 450 in the stack of alternating conductor layers 450 and insulator layers 475 to create a plurality of cavity regions 460 in substrate 401, in embodiments. At FIG. 4C1, silicon nitride or another high dielectric constant insulator may be added by depositing layer 409D over substrate 401 including alternating conductor layers 450 and insulator layers 475. In embodiments, at FIG. 4C2, the process includes growing or depositing a sacrificial protection layer 433 over layer 409D that may become the fifth IPD layer. Accordingly, next, in the embodiment, as shown in FIG. 4C3, sacrificial protection layer 433 may be etch processed to leave a portion of sacrificial protection layer 433 over layer 409D and over a region that will eventually form control gate 408. In embodiments, chemistries that provide high etch removal selectivity may be applied to silicon nitride. Next, as shown in FIG. 4C4, layer 409D may be etched to preserve isolation along a vertical direction between adjacent memory cells, in embodiments. Accordingly layer 409D may disappear along on exposed surface of substrate 401 in FIG. 4C4 but remains underneath remaining portion of sacrificial protection layer 433 (randy, please correct if I'm wrong here). At FIG. 4C5, in embodiments, the remaining portion of sacrificial protection layer 433 may be removed and a tapered etch may be applied to layer 409D to form the fifth IPD layer.

FIGS. 5A-5C illustrate an additional embodiment of one or more memory cells including similar elements as described above with respect to FIGS. 1-4. FIG. 5 includes a memory structure 501 including one or more memory cells 500a, 500b, and 500c, including a floating gate 505, control gate 508, and channel region 503. In embodiments, each of memory cells 500a, 500b, and 500c may be similar to the memory cells shown in respective FIGS. 1A, 1B, and FIGS. 4A, 4B; however, memory cells 500a, 500b, and 500c may include floating gates having a concave or plano-concave curvature, such as, for example as illustrated by plano-concave vertical surfaces 588 of floating gate 505. As shown in FIG. 5A, subsequently formed films, e.g., a channel semiconductor film 511 and tunnel dielectric layer 512 may also follow the topology of the plano-concave vertical surfaces 588 of floating gate 505. Note that FIGS. 5B and 5C illustrate a modification of stages of process 200 as described in FIGS. 3L and 3M. For example, similar to as described in FIG. 3L, FIGS. 5A and 5B may include a partial etchback of polysilicon material 505p; however, the partial etchback may include a plano-concave curvature. In the embodiment, FIG. 5C illustrates etchback of polysilicon material 505p to form discrete floating gates.

Figure 6C:
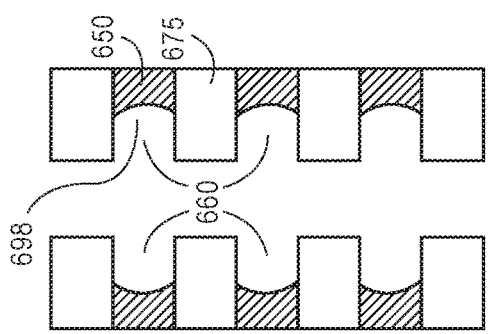
FIGS. 6A-6C illustrate an embodiment of a memory structure including one or more memory cells having a concave curvature of a control gate, in accordance with another embodiment of the present disclosure.
Figure 6B:
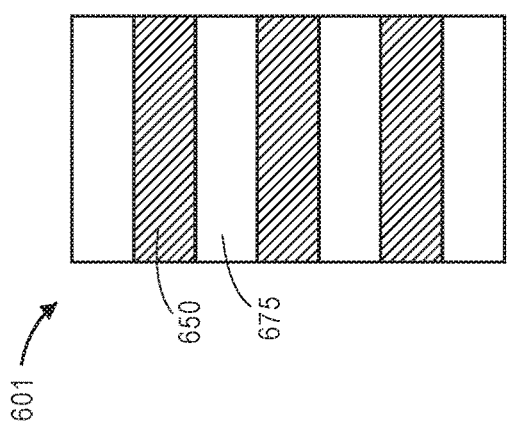
Figure 6A:
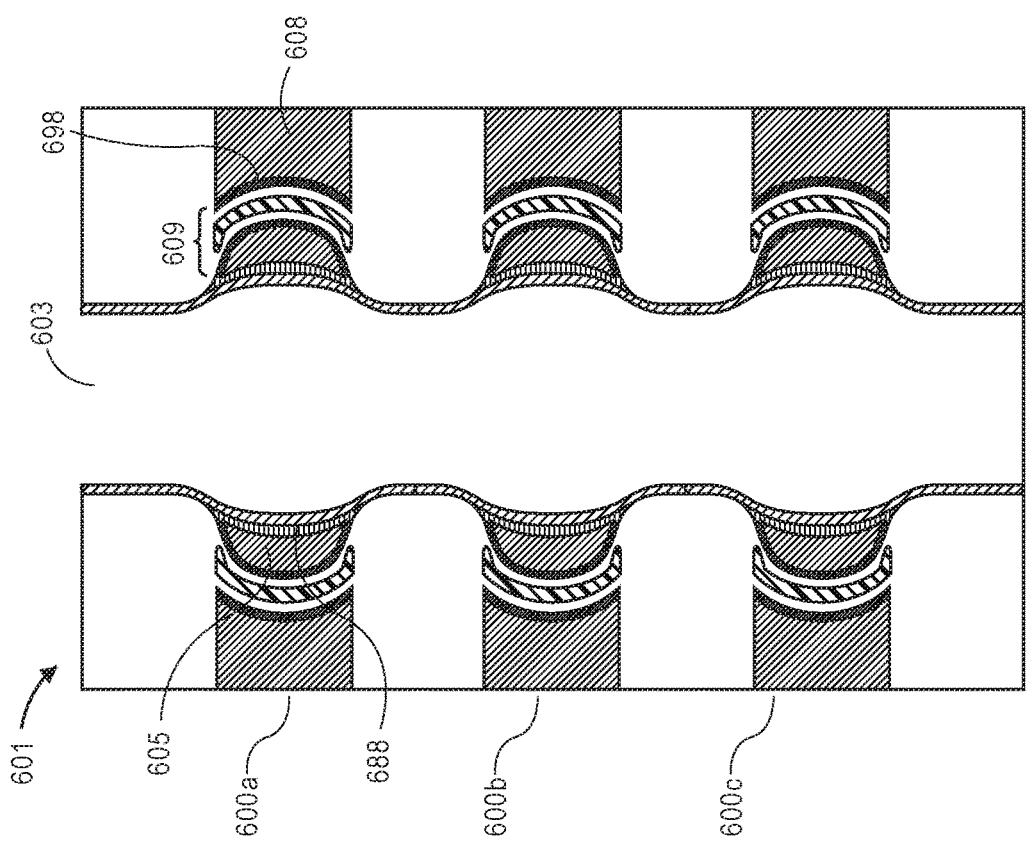

FIGS. 6A, 6B, and 6C illustrate an additional embodiment of one or more memory cells. In embodiments, memory cell structure 601 may include a memory cell 600 having a concave curvature 698 of a control gate 608. In embodiments, an interpoly dielectric (IPD) region 609 may be disposed between floating gate 605 and control gate 608 and may also follow concave curvature 698. As shown, for the embodiment, concave curvature 698 may be implemented with respect to a memory cell having a plano-concave curvature of a floating gate (similar to the embodiment of FIG. 5A-5C). In other embodiments, concave curvature 698 of a control gate 608 may be implemented with respect to a memory cell, e.g., memory cell 100 of FIGS. 1A and 1B, which may not include a plano-concave curvature of a floating gate. Note that FIGS. 6B and 6C illustrate a modification of stages of processes as described in FIGS. 3B and 3C. For example, similar to as described in FIG. 3B, FIG. 6B includes a front view of a memory cell structure 601 that includes alternating layers of conductor layer(s) 650 and insulator layer(s) 675. In embodiments, FIG. 6C illustrates isotropic etching of conductor layer(s) 650 to create a plurality of cavity regions 660. In the illustrated embodiment, a plurality of cavity regions 660 may include a shape that may become concave curvature 698 of conductor layer 650 that may eventually be included in control gate 608.

FIGS. 7A-7C2 illustrate an additional embodiment of one or more memory cell(s) 700 where a length $L_{FG}$ of a floating gate 705 may be longer than $L_{CG}$ of the control gate 708. In embodiments, a dielectric portion of deposition stages similar to those described with respect to FIGS. 3A-3C may be modified to include a first additional dielectric layer 778a and a second additional dielectric layer 778b on opposing sides of control gate 708. Accordingly in FIG. 7B, memory substrate or structure 701 includes an alternating stack of conductor layers 750 and insulator layers 775 including a first additional dielectric layer 778a and a second additional dielectric layer 778b sandwiching each of conductor layers 750, according to various embodiments. FIG. 7C illustrates forming of a channel region 703 in substrate 701 by anisotropic etching of a cylinder-shaped hole through substrate 701. Next, FIGS. 7C1 and 7C2 illustrate an embodiment where forming a plurality of control gates 708 includes isotropic etching of conductor layer(s) 750 and first additional dielectric layer 778a and a second additional dielectric layer 778b to create a plurality of cavity regions 760. In embodiments, the embodiment may be associated with a method as described with respect to U.S. Pat. No. 8,878,279, which is herein incorporated by reference.

Note that various operations of the process 200 and/or as additionally described with respect to FIGS. 4-7 are described as multiple discrete operations, in a manner that is most helpful in understanding the claimed subject matter. However, the order of description should not be construed as to imply that these operations are necessarily order dependent. It will be appreciated that the sequence of operations associated with the processes may vary and/or include other actions in accordance with the present disclosure. The memory arrays and methods described herein may be implemented into a system using any suitable hardware and/or software to configure as desired. Furthermore, it will be understood that various features of a memory device including one or more memory cell(s) as described, e.g., electrical routing features, interconnect structures, and the like, that may be formed in the memory device manufacturing process have not been shown in FIGS. 1-7 for ease of understanding.

Figure 8:
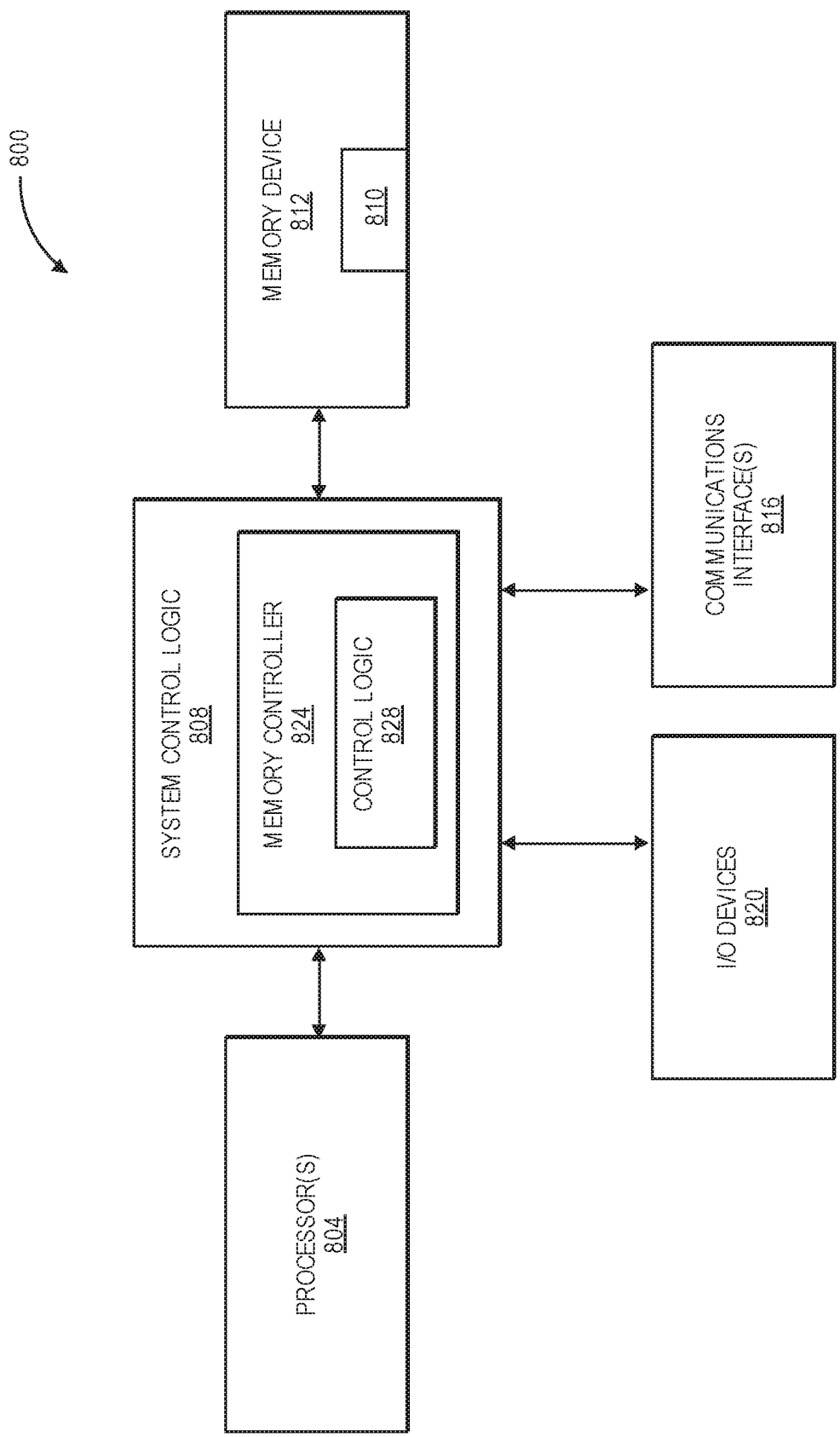
FIG. 8 illustrates an example computing device including a memory structure with one or more memory cells having a modified floating gate and dielectric layer geometry in accordance with various embodiments of the present disclosure.

FIG. 8 schematically illustrates an example computing device 800 including a memory array with one or more memory cells having a modified floating gate and dielectric layer geometry in accordance with embodiments of the present disclosure. The computing device 800 includes system control logic 808 coupled to one or more processor(s) 804; a memory device 812 having a memory array 810, e.g., a 3D NAND vertical string array, including one or more memory cells described in connection to FIGS. 1-7; one or more communications interface(s) 816; and input/output (I/O) devices 820.

The memory device 812 may be a non-volatile computer storage chip that may include a memory structure as described in connection with FIGS. 1-7. In embodiments, the memory device 812 may comprise a package having the memory device 812 disposed therein, driver circuitry (e.g., drivers), input/output connections to electrically couple the memory device 812 with other components of the computing device 800, etc. The memory device 812 may be configured to be removably or permanently coupled with the computing device 800. The memory device 812 may include a memory structure having one or more memory cells, e.g., such as described in reference to FIGS. 1-7. The memory structure may be formed using one or more of the techniques described with reference to FIGS. 3A-3O and FIGS. 4-7.

Communications interface(s) 816 provide an interface for computing device 800 to communicate over one or more network(s) and/or with any other suitable device. Communications interface(s) 816 may include any suitable hardware and/or firmware. Communications interface(s) 816 for one embodiment may include, for example, a network adapter, a wireless network adapter, a telephone modem, and/or a wireless modem. For wireless communications, communications interface(s) 816 for one embodiment may use one or more antennas to communicatively couple the computing device 800 with a wireless network.

For one embodiment, at least one of the processor(s) 804 may be packaged together with logic for one or more controller(s) of system control logic 808. For one embodiment, at least one of the processor(s) 804 may be packaged together with logic for one or more controllers of system control logic 808 to form a System in Package (SiP). For one embodiment, at least one of the processor(s) 804 may be integrated on the same die with logic for one or more controller(s) of system control logic 808. For one embodiment, at least one of the processor(s) 804 may be integrated on the same die with logic for one or more controller(s) of system control logic 808 to form a System on Chip (SoC).

System control logic 808 for one embodiment includes any suitable interface controllers to provide for any suitable interface to at least one of the processor(s) 804 and/or to any suitable device or component in communication with system control logic 808. The system control logic 808 may move data into and/or out of the various components of the computing device 800.

System control logic 808 for one embodiment includes a memory controller 824 to provide an interface to the memory device 812 to control various memory access operations. The memory controller 824 may include control logic 828 that may be specifically configured to control access of the memory device 812.

In various embodiments, the I/O devices 820 include user interfaces designed to enable user interaction with the computing device 800, peripheral component interfaces designed to enable peripheral component interaction with the computing device 800, and/or sensors designed to determine environmental conditions and/or location information related to the computing device 800. In various embodiments, the user interfaces could include, but are not limited to, a display, e.g., a liquid crystal display, a touch screen display, etc., a speaker, a microphone, one or more digital cameras to capture pictures and/or video, a flashlight (e.g., a light emitting diode flash), and a keyboard. In various embodiments, the peripheral component interfaces may include, but are not limited to, a non-volatile memory port, an audio jack, and a power supply interface. In various embodiments, the sensors may include, but are not limited to, a gyro sensor, an accelerometer, a proximity sensor, an ambient light sensor, and a positioning unit. The positioning unit may additionally/alternatively be part of, or interact with, the communication interface(s) 816 to communicate with components of a positioning network, e.g., a global positioning system (GPS) satellite.

In various embodiments, the computing device 800 may be a mobile computing device such as, but not limited to, a laptop computing device, a tablet computing device, a netbook, a smartphone, etc.; a desktop computing device; a workstation; a server; etc. Accordingly, the mobile computing device may further include at least one of a display communicatively coupled to the processor and/or a battery coupled to the processor.

The computing device 800 may have more or fewer components, and/or different architectures. In further implementations, the computing device 800 may be any other electronic device that processes data.

According to various embodiments, the present disclosure describes a number of examples.

Example 1 is a memory device that includes a plurality of memory cells, wherein at least one of the memory cells comprises a channel region; a floating gate adjacent to the channel region along a first side, wherein a length of the floating gate along a direction of the channel region is substantially longer than a length of the floating gate along an orthogonal direction of the channel region; a control gate adjacent to the floating gate along an opposing second side of the floating gate, wherein the floating gate extends at least as long as the control gate along the direction of the channel region and includes a tapered edge extending away from the channel region towards the control gate; and a dielectric layer disposed between the control gate and the floating gate, wherein the dielectric layer follows the tapered edge along the floating gate and forms a discrete region proximate to the floating gate to at least partially insulate the floating gate from an adjacent memory cell.

Example 2 is the memory device of Example 1, wherein the plurality of memory cells includes a vertical 3D NAND string of coupled memory cells along the direction of the channel region and the dielectric layer forms a discrete region for each memory cell.

Example 3 is the memory device of Example 1, wherein the dielectric layer comprises a middle dielectric layer of a multi-layer interpoly dielectric (IPD) region following the tapered edge and proximate to the floating gate.

Example 4 is the memory device of Example 3, wherein the middle dielectric layer comprises a material having a higher dielectric constant than silicon oxide and the IPD region comprises two oxide films, each disposed on opposing sides of the middle dielectric layer.

Example 5 is the memory device of Example 4, wherein the middle dielectric layer comprises silicon nitride.

Example 6 is the memory device of Example 3, further comprising a barrier layer comprising an insulator material disposed between the IPD region and the floating gate.

Example 7 is the memory device of Example 6, wherein the barrier layer is in direct contact with the floating gate and comprises silicon nitride.

Example 8 is the memory device of any one of Examples 1-7, wherein the channel region includes a semiconductor pillar comprising silicon oxide and including a polysilicon liner along a length of the semiconductor pillar.

Example 9 is the memory device of any one of Examples 1-8, wherein the tapered edge narrows the floating gate towards the control gate.

Example 10 is a system, comprising: a processor; and a memory coupled with the processor, wherein the memory includes a 3D-stacked memory array including a plurality of memory cells, wherein the plurality of memory cells comprises: a plurality of floating gates adjacent to a channel region, wherein a length of one or more of the floating gates along a direction of the channel region is substantially longer than along an orthogonal direction of the channel region; a plurality of control gates, each adjacent to a corresponding floating gate of the plurality of floating gates, wherein one or more of the corresponding floating gates extends at least as long as an adjacent control gate along the direction of the channel region and includes a tapered edge extending away from the channel region towards the adjacent control gate; and a dielectric layer disposed between one or more of the plurality of control gates and one or more of the corresponding floating gates and following the tapered edge along the one or more corresponding floating gates and forming a discrete region proximate to the one or more corresponding floating gates to assist in insulating the one or more corresponding floating gates from an adjacent memory cell.

Example 11 is the system of Example 10, wherein the dielectric layer comprises a middle dielectric layer of a multi-layer interpoly dielectric (IPD) region proximate to the one or more corresponding floating gates.

Example 12 is the system of Example 11, further comprising a barrier layer film disposed between the multi-layer IPD region and the one or more corresponding floating gates and forming a discrete barrier layer for a corresponding memory cell.

Example 13 is the system of Example 10, wherein the plurality of memory cells includes a vertical 3D NAND string and the dielectric layer insulates a memory cell in the plurality from a next memory cell in the vertical 3D NAND string.

Example 14 is the system of Example 10, wherein the channel region comprises a portion of a polysilicon pillar with a substantially circular cross-section.

Example 15 is the system of any one of Examples 10-14, wherein the system comprises a mobile computing device and further includes at least one of: a display communicatively coupled to the processor or a battery coupled to the processor.

Example 16 is a method to manufacture a memory device, comprising: forming, in a substrate, a channel region; forming a plurality of control gates adjacent to the channel region; forming, adjacent to the plurality of control gates, a corresponding plurality of floating gates, each floating gate to extend as long as a corresponding control gate along a direction of the channel region; and forming a dielectric layer, disposed between the plurality of control gates and the plurality of floating gates, wherein the dielectric layer is to follow a tapered edge along one or more of the floating gates and to form a discrete region proximate to the one or more floating gates to assist in insulating a memory cell including the one or more floating gates and corresponding control gates, and wherein a length of the floating gate along a direction of the channel region is substantially longer than a length of the floating gate along an orthogonal direction of the channel region.

Example 17 is the method of Example 16, further comprising forming the substrate by depositing alternating layers of conductor and insulator to form a stack of alternating conductor and insulator layers.

Example 18 is the method of Example 17, wherein forming the channel region in the substrate comprises anisotropic etching of a cylinder-shaped hole through the stack of alternating conductor and insulator layers.

Example 19 is the method of Example 18, wherein forming the plurality of control gates adjacent to the channel region comprises isotropic etching of conductor layers in the stack of alternating conductor and insulator layers to create a plurality of cavity regions.

Example 20 is the method of Example 19, wherein forming the dielectric layer comprises to form a multi-layer dielectric over the plurality of cavity regions.

Example 21 is the method of Example 20, wherein forming the multi-layer dielectric comprises: growing or depositing a first layer of the multi-layer dielectric comprising oxide over a bottom region of each of the plurality of cavity regions; growing or depositing a second layer of the multi-layer dielectric comprising silicon nitride over a surface of the substrate and including each of the plurality of cavity regions; growing or depositing a sacrificial protection layer over the second layer; and etch processing of the sacrificial protection layer to leave a portion of the sacrificial protection layer in a bottom of the cavity region.

Example 22 is the method of Example 21, further comprising to selectively oxidize or etch portions of the silicon nitride layer to form the tapered edge.

Example 23 is the method of Example 21, further comprising substantially isolating the multi-layer dielectric for each of one or more control gates and corresponding floating gate from an adjacent control gate and floating gate.

Example 24 is the method of Example 23, wherein substantially isolating the multi-layer dielectric for each of one or more control gates and corresponding floating gate from each of the other plurality of control gates and floating gates comprises: removing the sacrificial protection layer; removing portions of the second layer of the multi-layer dielectric covering insulator layers between each of one or more control gates in the plurality; and growing a third layer of the multi-layer dielectric to substantially insulate the silicon nitride layer.

Example 25 is the method of any one of Examples 20-23, further comprising depositing an additional layer over the multi-layer dielectric and over both the alternating layers of conductor and isolator and wherein the additional layer comprises an atomic layer deposition of silicon nitride.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to specific implementations disclosed in the specification and the claims. Rather, the scope is to be determined entirely by the following claims, which are to be construed in accordance with established doctrines of claim interpretation.

What is claimed is:

1. A memory device that includes a plurality of memory cells, wherein at least one of the memory cells comprises:
   a channel region;
   a floating gate adjacent to the channel region along a first side of the floating gate, wherein a length of the floating gate along a direction of the channel region is substantially longer than a length of the floating gate along an orthogonal direction of the channel region;
   a control gate adjacent to the floating gate along an opposing second side of the floating gate, wherein the floating gate extends at least as long as the control gate along the direction of the channel region and includes a tapered edge extending away from the channel region towards the control gate;
   a dielectric layer disposed between the control gate and the floating gate, wherein the dielectric layer follows the tapered edge along the floating gate and forms a discrete region proximate to the floating gate to at least partially insulate the floating gate from an adjacent memory cell; and
   a barrier layer disposed between the dielectric layer and the floating gate, wherein the barrier layer comprises an insulator material deposited to have a thickness that is similar along the opposing second side of the floating gate and the tapered edge of the floating gate.

2. The memory device of claim 1, wherein the plurality of memory cells includes a vertical 3D NAND string of coupled memory cells along the direction of the channel region and the dielectric layer forms a discrete region for each memory cell.

3. The memory device of claim 1, wherein the dielectric layer comprises a middle dielectric layer of a multi-layer interpoly dielectric (IPD) region following the tapered edge and proximate to the floating gate.

4. The memory device of claim 3, wherein the middle dielectric layer comprises a material having a higher dielectric constant than silicon oxide and the IPD region comprises two oxide films, each disposed on opposing sides of the middle dielectric layer.

5. The memory device of claim 4, wherein the middle dielectric layer comprises silicon nitride.

6. The memory device of claim 3, wherein the barrier layer is disposed between the IPD region and the floating gate.

7. The memory device of claim 6, wherein the barrier layer is in direct contact with the floating gate and comprises silicon nitride.

8. The memory device of claim 1, wherein the channel region includes a semiconductor pillar comprising silicon oxide and including a polysilicon liner along a length of the semiconductor pillar.

9. The memory device of claim 1, wherein the tapered edge narrows the floating gate towards the control gate.

10. A system, comprising:
    a processor; and
    a memory coupled with the processor, wherein the memory includes a 3D-stacked memory array including a plurality of memory cells, wherein the plurality of memory cells comprises:
    a plurality of floating gates adjacent to a channel region, wherein a length of one or more of the floating gates along a direction of the channel region is substantially longer than along an orthogonal direction of the channel region;
    a plurality of control gates, each adjacent to a corresponding floating gate of the plurality of floating gates, wherein one or more of the corresponding floating gates extends at least as long as an adjacent control gate along the direction of the channel region and includes a tapered edge extending away from the channel region towards the adjacent control gate;
    a dielectric layer disposed between one or more of the plurality of control gates and one or more of the corresponding floating gates and following the tapered edge along the one or more corresponding floating gates and forming a discrete region proximate to the one or more corresponding floating gates to assist in insulating the one or more corresponding floating gates from an adjacent memory cell; and one or more barrier layers disposed between the dielectric layer and the one or more corresponding floating gates, comprising an insulator material deposited to have a similar thickness along the tapered edge and the length of the one or more corresponding floating gates.

11. The system of claim 10, wherein the dielectric layer comprises a middle dielectric layer of a multi-layer interpoly dielectric (IPD) region proximate to the one or more corresponding floating gates.

12. The system of claim 11, wherein the one or more barrier layers disposed between the multi-layer IPD region and the one or more corresponding floating gates forms a discrete barrier layer for a corresponding memory cell.

13. The system of claim 10, wherein the plurality of memory cells includes a vertical 3D NAND string and the dielectric layer insulates a memory cell in the plurality from a next memory cell in the vertical 3D NAND string.

14. The system of claim 13, wherein the system comprises a mobile computing device and further includes at least one of:
a display communicatively coupled to the processor or
a battery coupled to the processor.

15. The system of claim 10, wherein the channel region comprises a portion of a polysilicon pillar with a substantially circular cross-section.

* * * * *